United States Patent [19]

Abbott et al.

[11] Patent Number: 4,928,266
[45] Date of Patent: May 22, 1990

[54] STATIC RAM WITH HIGH SPEED, LOW POWER RESET

[75] Inventors: Robert A. Abbott, Lake Oswego, Oreg.; Bruce Barbara, Dublin; Richard S. Roy, Pleasanton, both of Calif.

[73] Assignee: Visic, Inc., San Jose, Calif.

[21] Appl. No.: 199,010

[22] Filed: May 26, 1988

[51] Int. Cl.[5] ............................................. G11C 7/00
[52] U.S. Cl. ................................ 365/189.01; 365/154
[58] Field of Search ............... 365/154, 189, 190, 205, 365/218

[56] References Cited

U.S. PATENT DOCUMENTS 4,780,847 10/1988 Ito ........................................ 365/154

Primary Examiner—James W. Moffitt
Attorney, Agent, or Firm—Flehr, Hohbach, Test, Albritton & Herbert

[57] ABSTRACT

A static memory device is disclosed having an array of static memory cells, each memory cell having first and second cross-coupled inverters. All of the memory cells have distinct power voltage connections to the first and second inverters of each memory cell. When a reset signal occurs, the device's reset apparatus generates a voltage imbalance on the power voltage connections so that distinct voltage levels are applied to the first and second cross-coupled inverters of each memory cell. The voltage imbalance causes all of the memory cells in the array to be set into a predetermined state. In a preferred embodiment, the power voltage connections include a common high voltage power connection to all of the memory cells and distinct low voltage power connections to the first and second inverters of each memory cell. The reset apparatus applies a higher voltage potential on the low voltage power connection to the first inverters than the voltage potential applied on the low voltage power connection to the second inverters of each memory cell. As a result all memory cells are set into a state in which the internal storage nodes of the first inverters retain a higher voltage than the internal storage nodes of the second inverters. The memory cells are reset at very high speed and very low power, enabling use of a short reset pulse and a momentary power voltage imbalance to reset all of the cells in a memory device.

6 Claims, 5 Drawing Sheets

STATIC RAM WITH HIGH SPEED, LOW POWER RESET

The present invention relates generally to CMOS static random access memories, and particularly to a memory array with a high speed, low power reset feature for resetting the memory cells in the array to a predetermined state.

BACKGROUND OF THE INVENTION

A variety of electronic and computer systems include a reset function for resetting a memory array to a predetermined state, usually all zeros. Typical applications requiring a reset function are cache tag memories, cache memory, video display memories, and writable control storage.

The basic operation of a reset function is that the system generates a reset signal, and that reset signal is used to activate internal circuitry that causes all of the memory cells in a memory device or array to switch to a predetermined state.

FIG. 1 shows a standard six transistor CMOS static memory cell 10 having two cross-coupled CMOS inverters T1-T2 and T3-T4, and access control transistors T5 and T6 which couple the cell 10 to bit lines $\overline{BL}$ and BL. Each CMOS inverter has a P-channel transistor T1 or T3 with its source coupled to Vcc, the high voltage power supply for the memory, and its drain coupled to an N-channel transistor T2 or T4. The sources of the N-channel transistors T2 and T4 are coupled to Vss, the lower voltage power supply for the memory, also called the ground node.

The prior art includes SRAM devices having reset functions in which the device responds to a reset signal by setting all of the bit lines BL and $\overline{BL}$ to a predetermined state (e.g., BL=0 and $\overline{BL}$=1), and then activating all of the word lines in the device. This causes the bit value on the bit lines to be written simultaneously into all of the memory cells in the device.

One of the major draw backs of this approach to resetting a memory array is that all of the memory cells in the array which switch value will draw current at the same time. Furthermore, additional power will be consumed by the drivers for the bit lines and the drivers for the word lines. Thus, the reset function is likely to be the cause of the largest single current spike incurred by the memory device.

It would be possible to reduce the current spike associated with the reset function by splitting the memory array into two or more sections, and separately resetting each section by selecting the corresponding word lines after setting the bit lines to their predetermined states. While this will reduce the magnitude of the current spike associated with resetting the memory, it also increases the amount of time it takes to reset all of the cells in the memory device—which is not desirable In addition, this method of resetting a memory array may require a "reset recovery time" before the memory can be accessed, much like the "write recovery time" required by some memory devices after data is written into the device.

In general, the inventors have concluded that this prior art approach to memory reset is not practical for high density memories, particularly for memory devices with array sizes of 64k and larger, because the current spike caused by the reset function would be excessive.

Another prior art technique for resetting static memory devices, shown in FIG. 2, requires the addition of a reset transistor TR to every cell 15 in the memory. This has the obvious disadvantage of increasing the size of the memory cell and thus the size of the entire memory device. Furthermore, the reset transistor TR causes the memory cell to be nonsymmetric and upsets the capacitive balance of the memory cell 15, which can be compensated for, but is generally undesirable.

It is therefore an object of the present invention to provide a memory reset apparatus and method which minimizes the current spike problems associated with the first prior approach discussed above, and which does not increase the size of the memory cell.

Another object of the present invention is to provide a memory reset apparatus and method which is both very fast, and uses a relatively small amount of power.

SUMMARY OF THE INVENTION

In summary, the present invention is a reset apparatus and method for a static memory array which circumvents the normal data writing cycle. Reset is accomplished by providing separate Vss and/or separate Vcc power connections to each half of each memory cell in the memory array. When reset is initiated, the memory's word lines are deactivated, and a voltage imbalance is generated in the power connections to the memory cells by providing a different voltage on the separate power connections to each half of each memory cell. This automatically resets all of the memory cells in the array to a predetermined state. Furthermore, the reset is accomplished at extremely high speed while using very little power.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Unlike the prior art "bit line writing" method of resetting all of the cells in a memory device, the reset function in the present invention uses neither the bit lines nor the word lines of the memory device. Instead, reset is accomplished by providing unbalanced power supply voltages to the two halves of each memory cell.

Figure 3:
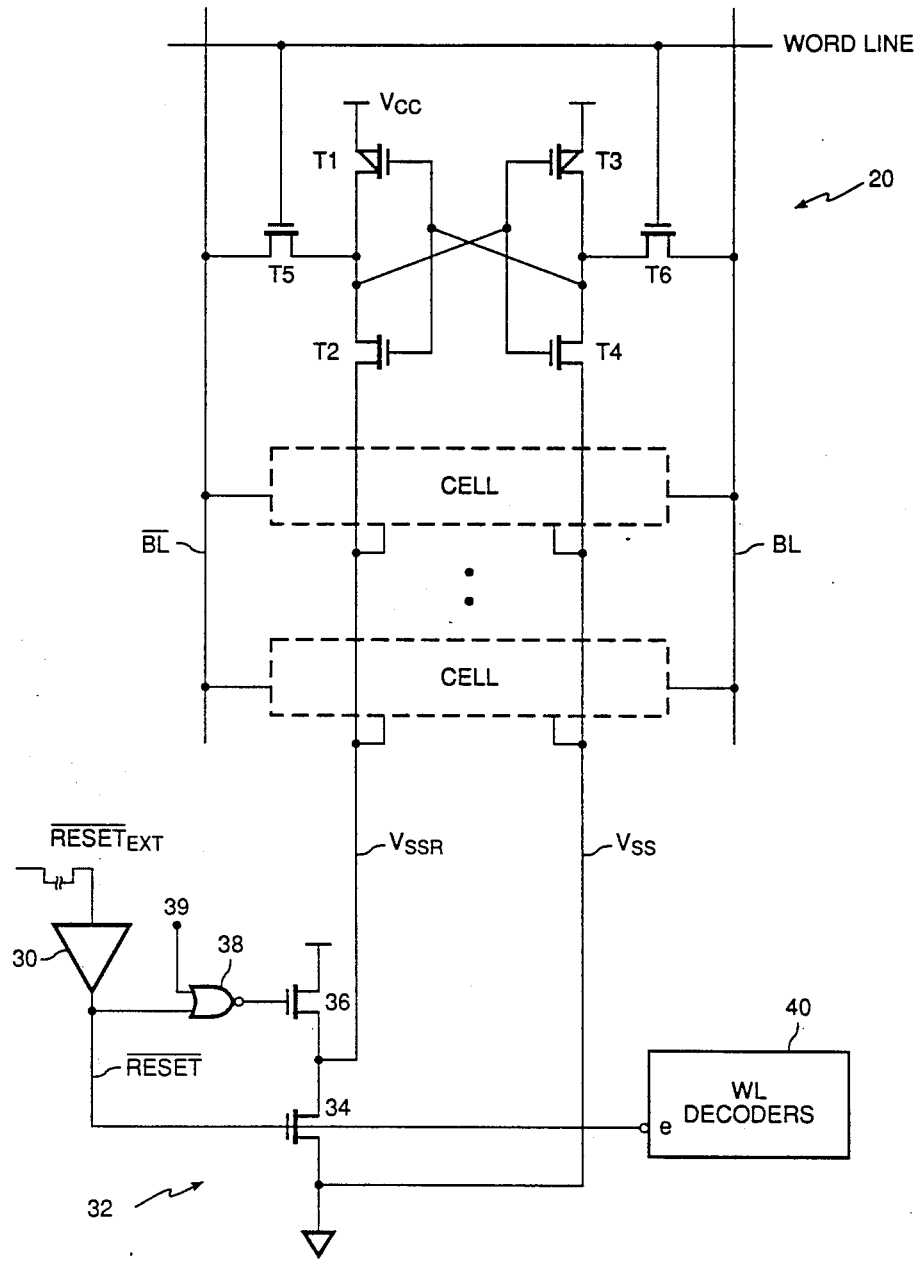
FIG. 3 shows a modified six transistor CMOS static memory cell, with one of its Vss connections replaced by a Vssr connection, in accordance with the present invention.

In a first preferred embodiment, shown in FIG. 3, the memory device provides two distinct low voltage connections to each cell: Vss and Vssr. Reset is accomplished by replacing the normal low voltage level on one of the two low voltage connections, Vssr, with a higher voltage. The resulting voltage imbalance causes all of the cells in the array to be set into a predetermined state.

Figure 1:
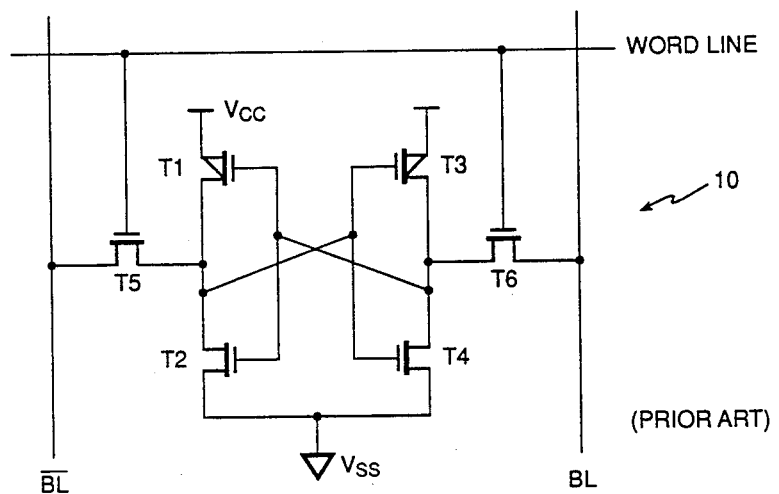
FIG. 1 shows a standard six transistor CMOS static memory cell.
Figure 2:
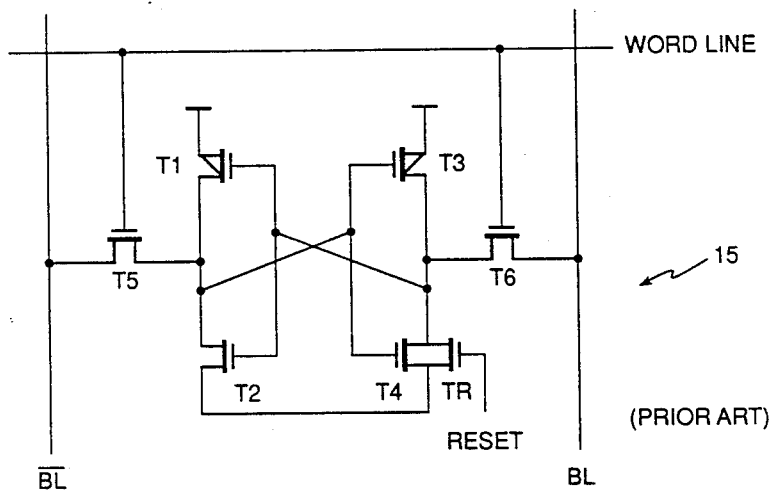
FIG. 2 shows a modified standard six transistor CMOS static memory cell with a reset transistor.

FIG. 3 shows a modified six transistor CMOS static memory cell 20 which has the same general configuration as the prior art cell 10 shown in FIG. 1, except that the source of N-channel transistor T2 is coupled to a different power supply node, labelled Vssr, than the N-channel transistor T4 on the other side of the cell, which is coupled to the low voltage power supply Vss for the memory device. For convenience, the two internal storage nodes of the cell 20 are labelled N1 and N2.

The circuitry for generating Vssr is shown in the bottom half of FIG. 3. Reset is initiated by an external reset signal $\overline{Reset}_{ext}$. A buffer 30 is used to buffer the external reset signal $\overline{Reset}_{ext}$ and to generate an internal reset signal $\overline{Reset}$ that is used both to generate Vssr and to disable the word line decoders 40.

Note that negative logic signals, which are active when at a low voltage and inactive when at a high voltage, are herein denoted by a "bar" over the signal's name, e.g., $\overline{X}$. The circuit 32 for generating Vssr comprises a pull down transistor 34, a pull up transistor 36, and an NOR gate 38 driven by the internal reset signal $\overline{Reset}$. Since the reset signal $\overline{Reset}$ is normally high (i.e., off), the down transistor 34 will normally couple Vssr to the device's low voltage potential Vss, and the pull up transistor 36 will normally be off. Thus, during normal operating conditions both halves of the memory cell 20 have the sources of their N-channel transistors coupled the device's low voltage potential Vss.

For the purposes of this discussion, NOR gate 38 acts an inverter which generates a high voltage output when the internal reset signal $\overline{Reset}$ goes low. As will be explained with reference to FIGS. 8a and 8b, however, the NOR gate 38 can be used to generate a delayed Vssr signal for a phased reset, by generating a delayed reset signal on input 39 to the NOR gate 38.

When a reset occurs, the internal reset signal $\overline{Reset}$, which is normally high (i.e., inactive), goes low. This disables the pull down transistor 34. Furthermore, the NOR gate 38 generates a high output signal on the gate of the pull up transistor 36, which drives Vssr high.

Figure 4:
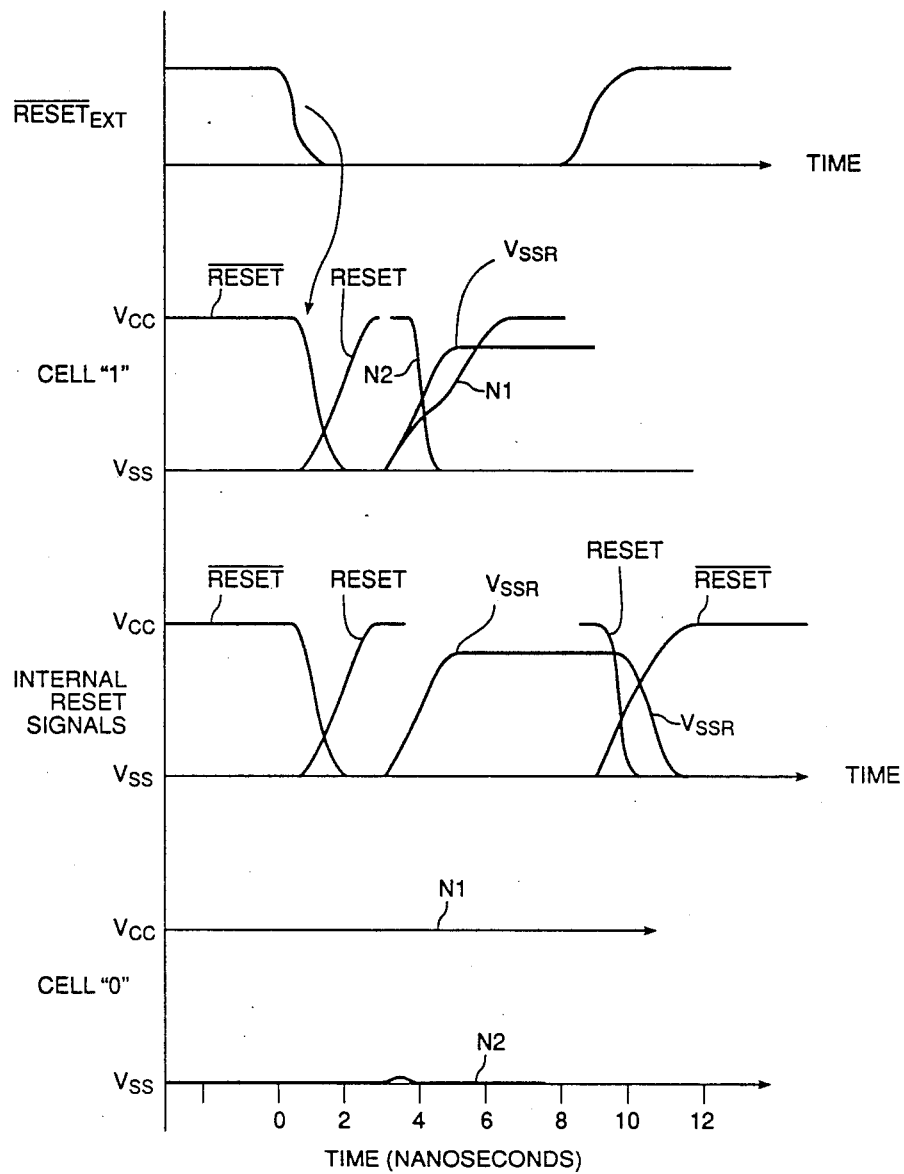
FIG. 4 is a timing diagram showing the operation of the memory cell of FIG. 3 during reset.

A timing diagram of the operation of two memory cells during reset is shown in FIG. 4. The first timing diagram is for a memory cell that initially is storing a data value of "1", and the second timing diagram is for a memory cell that initially stores a data value of "0". Clearly, cells which already store a data value of "0" are not affected by the reset sequence, except possibly for an insignificant voltage rise on node N2 caused by capacitive coupling of node N2 to the Vssr line.

As shown in the upper half of the timing diagram in FIG. 4, for cells initially storing a value of "1", when Vssr begins to rise, node N1 initially follows Vssr because the voltage on node N2 is high, which turns on transistor T2. When the voltage on node N1 exceeds the threshold voltage of the N-channel transistors, transistor T4 turns on, pulling node N2 node toward Vss. By the time that node N2 is pulled low enough to turn off transistor T2 (typically about one half nanosecond from the time that transistor T4 is turned on), node N1 is typically at least two threshold voltages above Vss (i.e., has risen to at least two volts). Therefore the voltage on node N2 continues to rapidly fall to Vss while the voltage on node N1 is pulled up by P-channel transistor T1 to a voltage of Vcc.

While Vssr rises to a voltage of only $Vcc - |V_{th(N)}|$, i.e., one threshold below Vcc, the Vssr signal does not need to rise all the way to Vcc because transistor T2 in the memory cell turns off well before Vssr reaches its peak value.

Referring again to FIG. 3, in order to minimize the amount of current drawn by the memory cells during reset, the bit lines BL and $\overline{BL}$ are isolated from the memory cells 20 during reset functions by using the internal reset signal $\overline{Reset}$ to disable the word line decoders 40. In other words, all of the word lines are forced to a low voltage by an active $\overline{Reset}$ signal. If the word line decoders 40 were not disabled, one of the word lines would be active, and the corresponding memory cell would drive the bit lines (i.e., so that BL=0 and $\overline{BL}$=1) and thereby draw much more current than necessary. Disabling the word line decoders 40 also allows the bit lines to be precharged and/or equalized during reset, thereby allowing a new read or write cycle to be performed immediately after completion of a reset operation with minimal "reset recovery time."

Figure 5:
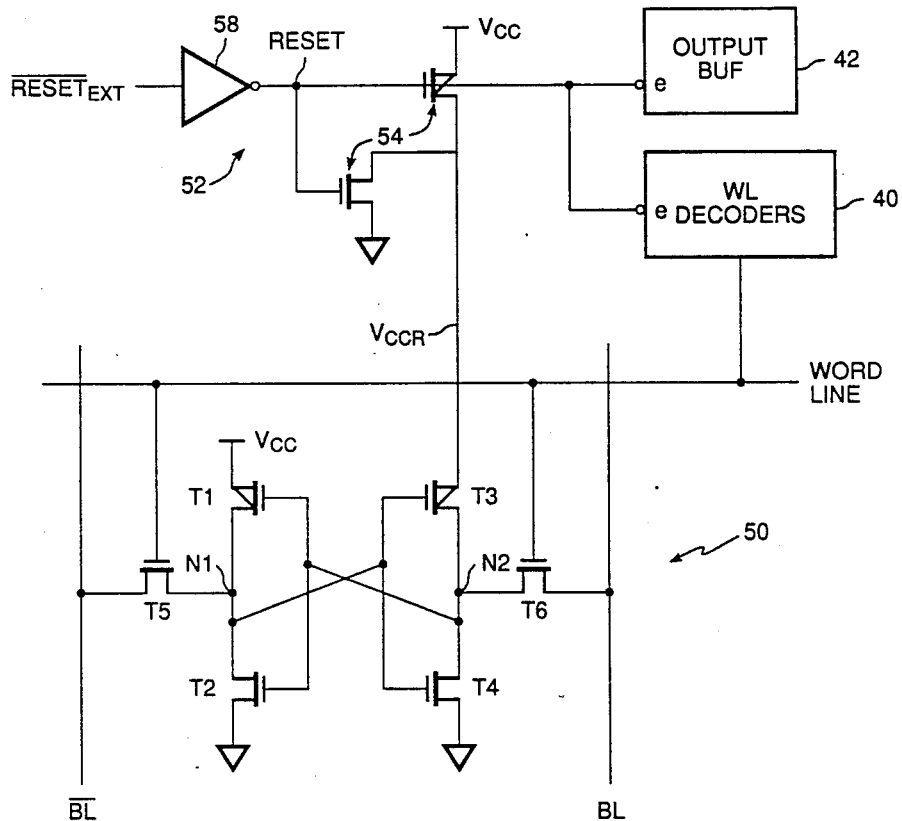
FIG. 5 depicts a second CMOS memory cell in accordance with the present invention.

In a second preferred embodiment, shown in FIG. 5, the memory device provides memory cells 50 with two distinct high voltage connections to each cell: Vcc and Vccr. Reset is accomplished by momentarily replacing the normal high voltage level on one of the two high voltage connections, Vccr, with a lower voltage. The resulting voltage imbalance causes all of the cells in the array to be set into a predetermined state.

The circuit 52 for generating Vccr comprises a CMOS inverter 54 with an output of Vccr, and an inverting buffer 58 that buffers and converts the external reset signal $\overline{Reset}_{ext}$ into an internal reset signal Reset. The CMOS inverter 54 inverts the internal reset signal Reset to generate Vccr. During normal operating conditions Vccr is at the same voltage potential as Vcc, and both halves of the memory cell 50 have the sources of their P-channel transistors coupled to the device's high voltage potential.

When a reset occurs, the internal reset signal Reset goes high and Vccr is pulled down toward Vss. For cells initially storing a value of "1", node N2 initially follows Vccr because transistor T3 is on. When the voltage on node N2 falls below the threshold voltage of the P-channel transistor T1, transistor T1 turns on and begins pulling node N1 node up toward Vcc—although the pull up is initially slow because transistor T2 is still on. By the time that node N2 is pulled low enough to turn off transistor T3 (i.e., one P-channel threshold above the voltage on node N1), node N1 is sufficiently above one N-channel threshold voltage to turn on transistor T4 and pull node N2 the rest of the way to Vss. Therefore, as the voltage on node N2 continues to fall to Vss, the voltage on node N1 is pulled up by P-channel transistor T1 to a voltage of Vcc.

This second embodiment of the invention is generally slower than the embodiment shown in FIG. 3 because the P-channel transistors in SRAM memory cells are generally smaller than the N-channel transistors, which causes the critical voltage on node N2 to switch more slowly than in the first preferred embodiment. In memory devices with more evenly sized pull up and pull down transistors in the memory cells, this embodiment performs a reset at speeds reasonably close to those of the first preferred embodiment.

Figure 6:
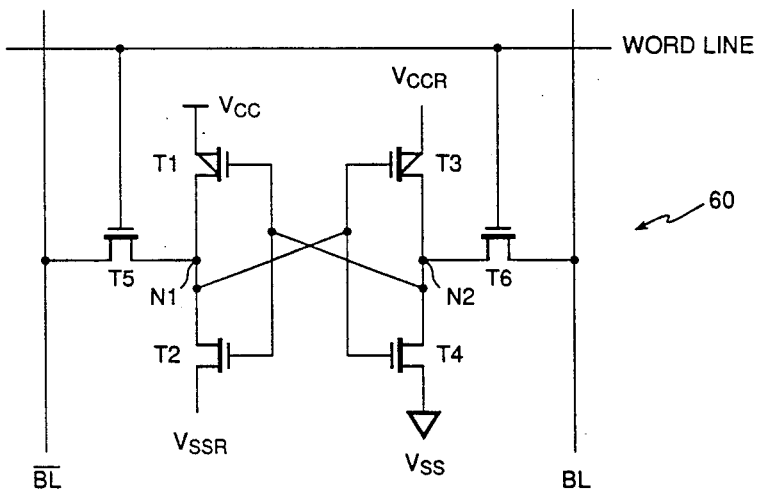
FIG. 6 depicts a third CMOS memory cell in accordance with the present invention.

In a third preferred embodiment, shown in FIG. 6, the memory device provides memory cells 60 with two distinct high voltage connections, Vcc and Vccr, and two distinct low voltage connections, Vss and Vssr, to each cell. Reset is accomplished by replacing the normal high voltage level on one of the two high voltage connections, Vccr, with a lower voltage, and substantially simultaneously replacing the normal low voltage level on Vssr on the opposite half of each memory cell with a higher voltage level.

The circuits for generating Vssr and Vccr are substantially the same as circuits 32 and 52 in FIGS. 3 and 5, respectively. Furthermore, the operation of this memory cell during reset is substantially the same as for the cell shown in FIG. 3, except that for cells with initially storing a value of "1", node 2 will be pulled down even faster due to the combined actions of both Vssr and Vccr, and thus the memory cells in the array will be reset at extremely high speed. In addition, the CMOS crossover current through each half of the CMOS memory will be eliminated.

Figure 7:
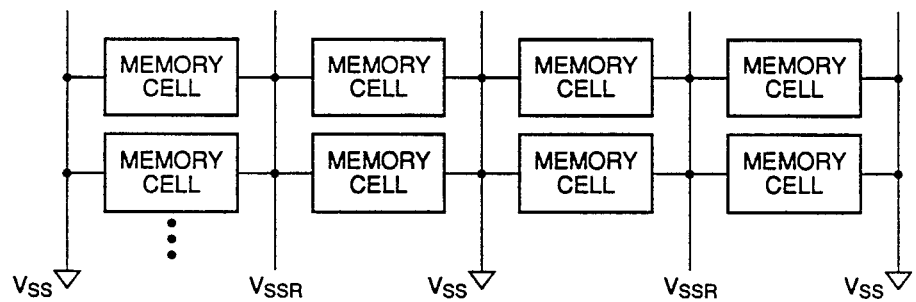
FIG. 7 shows a generalized layout plan for memory arrays using the memory cells shown in FIGS. 3 and 5.

FIG. 7 shows a generalized layout plan for memory arrays using the memory cells shown in FIG. 3. In particular, by alternating the low voltage supply lines Vss and Vssr running the length of each column of memory cells, each of the low voltage supply lines can serve two columns of cells. Therefore the use of two distinct low voltage supply lines will not, in most cases, increase the amount of space required for a memory array. In other words, a memory array using the cells shown in FIG. 3 will fit into the same amount of space as a memory array using the prior art cells shown in FIG. 1, assuming that equal sized transistors are used in both memory arrays.

Phased Reset.

Figure 8A:
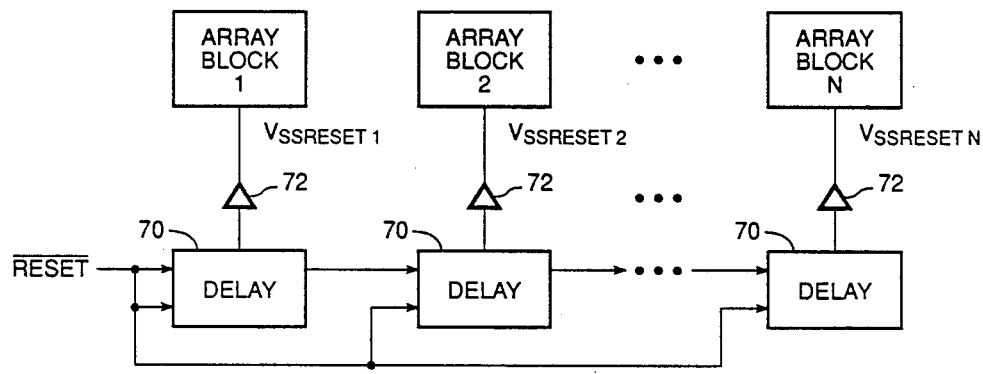
FIGS. 8a and 8b show circuit schematics of circuits for a phased reset function.
Figure 8B:
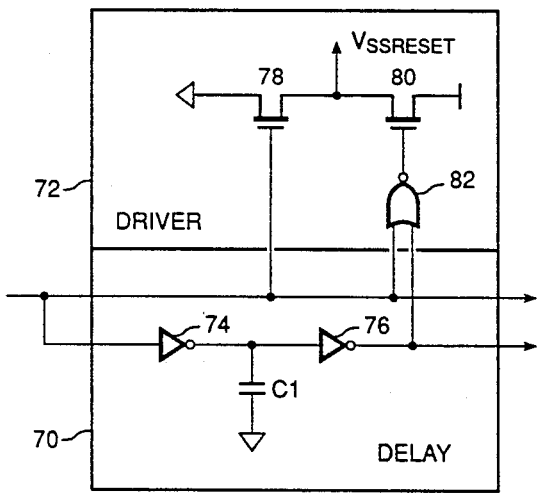

Referring to FIGS. 8a and 8b, there is shown a circuit schematic for a phased reset of several subarrays, or array blocks, in a memory device. The purpose of using a phased reset is to reduce the magnitude of the current spike caused by resetting a high density memory device. Furthermore, since the resetting process in the present invention is extremely fast, it is possible to use a phased reset with several separate phases to reduce the current spike even within a period of time equal to that of a single memory access cycle.

In the preferred embodiment, the length of the reset process from the time that Vssr begins to rise to the completion of the resetting of the cells coupled to Vssr is typically less than 4 nanoseconds, with most of the current being drawn during a 2 nanosecond interval. Given a memory access cycle time of 25 nanoseconds, and 8 nanoseconds for generating and then extinguishing the internal reset signals, there is sufficient time for 8 separate phased resets with a two nanosecond delay between phases.

Referring to FIG. 8a, the phased reset mechanism comprises a chain of N delay elements 70, the first of which is driven by the internal reset signal Reset, and N reset drivers 72, each driven by one of the delay elements 70. A circuit diagram for one delay element 70 and reset driver 72 is shown in FIG. 8b. The delay element 70 comprises two inverters 74 and 76 separated by a capacitor C1 sized in accordance with the desired delay between phased reset signals. The reset driver circuit 72 comprises two N-channel transistors 78 and 80. Transistor 78 pulls Vssreset low in response to a high signal on $\overline{\text{Reset}}$. Transistor 80 pulls Vssreset high when the output of NOR gate 82 is high, which happens when $\overline{\text{Reset}}$ is low, and the delayed reset signal on node 84 goes low. When Reset goes high again, transistor 78 in each of the delay elements 70 pulls all the Vssreset signals low simultaneously.

Using this type of a phased reset, with N separately phased reset signals Vssreset1 to VssresetN, the maximum current drawn during reset will be between 1/N and 2/N times the maximum current which would be drawn if the entire memory were reset simultaneously.

ALTERNATE EMBODIMENTS

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For example, referring to FIG. 3, in an alternate embodiment of the invention the reset signal buffer 30 is a "one shot" or multivibrator, triggered by negative edge signals on the external reset line $\overline{\text{Reset}}_{ext}$. The one shot generates a single negative $\overline{\text{Reset}}$ pulse, having a duration of approximately 15 to 30 nanoseconds whenever a downward edge is detected on the $\overline{\text{Reset}}_{ext}$ line. The advantage of using a one shot 30 buffer for the $\overline{\text{Reset}}_{ext}$ signal is that it automatically disengages the reset circuitry once the reset function is complete, regardless of the state of the $\overline{\text{Reset}}_{ext}$ signal. Furthermore, the one shot 30 can be designed so that the duration of the reset pulse is no longer than one normal memory cycle, thereby allowing reset to be treated logically as the same as other memory access cycles.

Since resetting all of the memory cells in the memory array requires only a momentary imbalance of the voltages applied to the two inverters in each memory cell, a reset pulse of very short duration will be adequate to ensure that all of the cells in the memory are reset. In some embodiments of the present invention the length of the reset pulse is controlled by an external reset signal, while in others it can be controlled by internal circuitry such as the one shot mentioned above.

In another alternate embodiment, the internal reset signal $\overline{\text{Reset}}$ is also used to disable the output buffer (see buffer 42 in FIG. 5) of the memory device so that the memory's output will not reflect old data that has been erased from the device's cells.

What is claimed is:

1. In a static memory device comprising an array of static memory cells, each memory cell having first and second cross-coupled inverters, the improvement comprising: power voltage connections to said memory cells including distinct power voltage connections to said first and second inverters of each said memory cell; and reset means, coupled to said power voltage connections and responsive to a reset signal, for generating a voltage imbalance on said power voltage connections in response to said reset signal so that distinct voltage levels are applied to said first and second cross-coupled inverters of each memory cell, said voltage imbalance causing all of said memory cells in said array to be set into a predetermined state;

said static memory device including a multiplicity of bit lines for conveying data values stored in said memory cells, and a multiplicity of word lines for enabling the conveyance of data values for corresponding memory cells to corresponding ones of said bit lines; said reset means including means for disabling said multiplicity of word lines in response to said reset signal so that said memory cells are isolated from said bit lines while said memory cells are set to said predetermined state.

2. In a static memory device comprising an array of static memory cells, each memory cell having first and second cross-coupled inverters, the improvement comprising: power voltage connections to said memory cells including distinct power voltage connections to said first and second inverters of each said memory cell; and reset means, coupled to said power voltage connections and responsive to a reset signal, for generating a voltage imbalance on said power voltage connections in response to said reset signal so that distinct voltage levels are applied to said first and second cross-coupled inverters of each memory cell, said voltage imbalance causing all of said memory cells in said array to be set into a predetermined state;

said memory array including a plurality of subarrays; said power voltage connections to said memory cells including separate sets of power voltage connections for each said subarray, each set of power voltage connections having distinct power voltage connections to said first and second inverters of each said memory cell; said reset means including:

delay means responsive to said reset signal for generating a plurality of distinct, staggered partial reset signals; and a plurality of distinct partial reset means, each coupled to a corresponding set of power voltage connections and responsive to a corresponding partial reset signal, for generating a voltage imbalance on said corresponding set of power voltage connections in response to said partial reset signal so that distinct voltage levels are applied to said first and second cross-coupled inverters of each memory cell in the corresponding subarray, said voltage imbalance causing all of said memory cells in said subarray to be set into a predetermined state.

3. In a static memory device comprising an array of static memory cells, each memory cell having first and second cross-coupled inverters, the improvement comprising: high and low voltage power connections to each of said memory cells, including at least one distinct power voltage connection to said first and second inverters of each said memory cell; and reset means, coupled to said power voltage connections and responsive to a reset signal, for generating a distinct voltage potential on said at least one distinct power voltage connection to said first and second inverters of each said memory cell, said distinct voltage potential causing all of said memory cells in said array to be set into a predetermined state;

said static memory device including a multiplicity of bit lines for conveying data values stored in said memory cells, and a multiplicity of word lines for enabling the conveyance of data values for corresponding memory cells to corresponding ones of said bit lines; said reset means including means for disabling said multiplicity of word lines in response to said reset signal so that said memory cells are isolated from said bit lines while said memory cells are set to said predetermined state.

4. In a static memory device comprising an array of static memory cells, each memory cell having first and second cross-coupled inverters, the improvement comprising: high and low voltage power connections to each of said memory cells, including at least one distinct power voltage connection to said first and second inverters of each said memory cell; and reset means, coupled to said power voltage connections and responsive to a reset signal, for generating a distinct voltage potential on said at least one distinct power voltage connection to said first and second inverters of each said memory cell, said distinct voltage potential causing all of said memory cells in said array to be set into a predetermined state;

said memory array including a plurality of subarrays; said power voltage connections to said memory cells including separate sets of power voltage connections for each said subarray, each set of power voltage connections having distinct power voltage connections to said first and second inverters of each said memory cell; said reset means including:

delay means responsive to said reset signal for generating a plurality of distinct, staggered partial rest signals; and a plurality of distinct partial reset means, each coupled to a corresponding set of power voltage connections and responsive to a corresponding partial reset signal, for generating a voltage imbalance on said corresponding set of power voltage connections in response to said partial reset signal so that distinct voltage levels are applied to said first and second cross-coupled inverters of each memory cell in the corresponding subarray, said voltage imbalance causing all of said memory cells in said subarray to be set into a predetermined state.

5. A method of resetting all of the memory cells in a static memory device to a predetermined state, said memory device comprising an array of static memory cells, each memory cell having first and second cross-coupled inverters, the steps of the method comprising:

providing high and low voltage power connections to each of said memory cells, including at least one distinct power voltage connection to said first and second inverters of each said memory cell; and in response to a reset signal, generating a distinct voltage potential on said at least one distinct power voltage connection to said first and second inverters of each said memory cell, said distinct voltage potential causing all of said memory cells in said array to be set into a predetermined state;

said memory device including a multiplicity of bit lines for conveying data values stored in said memory cells, and a multiplicity of word lines for enabling the conveyance of data values for corresponding memory cells to corresponding ones of said bit lines; said method including the step of disabling said multiplicity of word lines in response to said reset signal so that said memory cells are isolated from said bit lines while said memory cells are set to said predetermined state.

6. A method as set forth in claim 5, said array of memory cells including a plurality of subarrays; said providing step including the step of providing separate sets of power voltage connections for each said subarray, each set of power voltage connections having distinct power voltage connections to said first and second inverters of each said memory cell;

said generating step including the step of generating, in response to a reset signal, a plurality of distinct, staggered partial reset signals; and, in response to each of said partial reset signals, generating a voltage imbalance on a corresponding set of power voltage connections so that distinct voltage levels are applied to said first and second cross-coupled inverters of each memory cell in said corresponding subarray, said voltage imbalance causing all of said memory cells in said subarray to be set into a predetermined state.

* * * * *